(12) United States Patent
Doornbos

(10) Patent No.: US 12,707,620 B2
(45) Date of Patent: Aug. 11, 2026

(54) STATIC RANDOM ACCESS MEMORY AND MANUFACTURING METHOD THEREOF

(71) Applicant: TAIWAN SEMICONDUCTOR MANUFACTURING COMPANY, LTD., Hsinchu (TW)

(72) Inventor: Gerben Doornbos, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 621 days.

(21) Appl. No.: 18/099,340

(22) Filed: Jan. 20, 2023

(65) Prior Publication Data

US 2024/0130099 A1 Apr. 18, 2024

Related U.S. Application Data

(60) Provisional application No. 63/415,725, filed on Oct. 13, 2022.

(51) Int. Cl.
*H10B 10/00* (2023.01)

(52) U.S. Cl.
CPC .................................. *H10B 10/125* (2023.02)

(58) Field of Classification Search
None
See application file for complete search history.

(56) References Cited

U.S. PATENT DOCUMENTS 11,087,832 B1 * 8/2021 Gomes .................. H10B 10/12
2013/0299917 A1 * 11/2013 Yang ..................... H10D 84/83 257/401
2015/0318288 A1 * 11/2015 Lim .................... H10D 30/025 257/329
2018/0174642 A1 * 6/2018 Huynh Bao ......... H10D 62/121
2019/0267387 A1 * 8/2019 Lim ....................... H10B 10/12
2019/0287957 A1 * 9/2019 Anderson ............ H10D 62/122
2020/0258891 A1 * 8/2020 Huang ................... H10B 10/12
2021/0202499 A1 * 7/2021 Gardner ............... H10B 10/125
2021/0202500 A1 * 7/2021 Chanemougame ......................... H01L 21/02603
2022/0302121 A1 * 9/2022 Gutwin ................ G11C 11/404

* cited by examiner

*Primary Examiner* — Khaja Ahmad
(74) *Attorney, Agent, or Firm* — Birch, Stewart, Kolasch & Birch, LLP

(57) ABSTRACT

A static random access memory and a manufacturing method thereof are provided. The static random access memory includes a first complementary field effect transistor (CFET), a second CFET, a first pass fate transistor and a second pass gate transistor. The first CFET and the second CFET are disposed in a first tier. The first pass gate transistor is connected to the first CFET through a first path. The second pass gate transistor is connected to the second CFET through a second path. The first pass gate transistor and the second pass gate transistor are disposed in a second tier.

20 Claims, 22 Drawing Sheets

STATIC RANDOM ACCESS MEMORY AND MANUFACTURING METHOD THEREOF

PRIORITY CLAIM AND CROSS-REFERENCE

This application claims the benefit of U.S. provisional application Ser. No. 63/415,725, filed Oct. 13, 2022, the subject matter of which is incorporated herein by reference.

BACKGROUND

The disclosure relates in general to an advanced logic and a high density cache memory, and more particularly to a static random access memory and a manufacturing method thereof.

A high-density SRAM cells may comprise several transistors. Typically, some of these transistors cannot be formed in a pair, so the space is wasted and the manufacturing process is complex.

Further, those transistors are located in one tier, so the connecting paths are complex, and many contacts are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
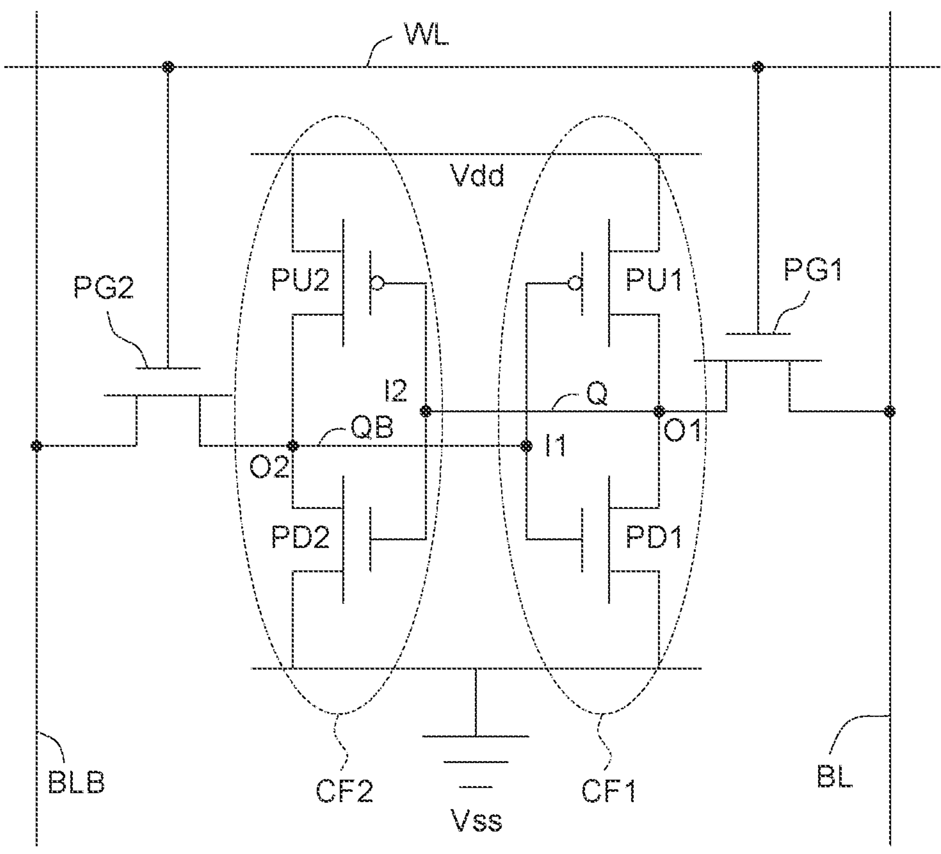
FIG. 1 shows a circuit diagram of a static random access memory (SRAM) according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a circuit diagram of a static random access memory (SRAM) 100 according to one embodiment. The SRAM 100 includes, for example, a first complementary field effect transistor (CFET) CF1, a second CFET CF2, a first pass gate transistor PG1 and a second pass gate transistor PG2. The first CFET CF1 and the second CFET CF2 form two cross-coupled inverters. That is, the output O1 of one inverter, such as the first CFET CF1, is connected to the input I2 of another inverter, such as the second CFET CF2, through a first path Q. The input I1 of one inverter, such as the first CFET CF1, is connected to the output O2 of another inverter, such as the second CFET CF2, through a second path QB.

The first CFET CF1 includes a first pull down transistor PD1 and a first pull up transistor PU1. The first pull down transistor PD1 is, for example, an nFET and the first pull up transistor PU1 is, for example, a pFET. The source of the first pull up transistor PU1 is connected to a supply voltage Vdd (or a high voltage). The source of the first pull down transistor PD1 is connected to a ground voltage Vss (or a low voltage). The drain of the first pull up transistor PU1 and the drain of the first pull down transistor PD1 are connected to an output of the first CFET CF1. The gate of the first pull up transistor PU1 and the gate of the first pull down transistor PD1 are connected to an input of the first CFET CF1.

The second CFET CF2 includes a second pull down transistor PD2 and a second pull up transistor PU2. The second pull down transistor PD2 is, for example, an nFET and the second pull up transistor PU2 is, for example, a pFET. The source of the second pull up transistor PU2 is connected to a supply voltage Vdd (or a high voltage). The source of the second pull down PD1 is connected to a ground voltage Vss (or a low voltage). The drain of the second pull up transistor PU2 and the drain of the second pull down transistor PD2 are connected to an output of the second CFET CF2. The gate of the second pull up transistor PU2 and the gate of the second pull down transistor PD2 are connected to an input of the second CFET CF2.

The output O1 of one inverter, such as the first CFET CF1, is connected to a first bit line BL through the first pass gate transistor PG1. The output O2 of another inverter, such as the second CFET CF2, is connected to a second bit line BLB through the second pass gate transistor PG2. The pass gates PG1 and PG2 are, for instance, nFETs.

The gate of the first pass gate transistor PG1 and the gate of the second pass gate transistor PG2 are connected to a word line WL.

As shown in FIG. 1, the first pull up transistor PU1 and the first pull down transistor PD1 form a complementary pair. Similarly, the second pull up transistor PU2 and the second pull down transistor PD2 form a complementary pair. These complementary pairs can be made in one single process to form complementary (C)FETs. However, the first pass gate PG1 and the second pass gate PG2 do not form such pairs. If the pass gates are nFETs, forming a pass gate in a CFET process means that the complementary pFET is not utilized, so space is wasted, or the complementary pFET must be removed, which makes the manufacturing process complex.

Figure 2A:
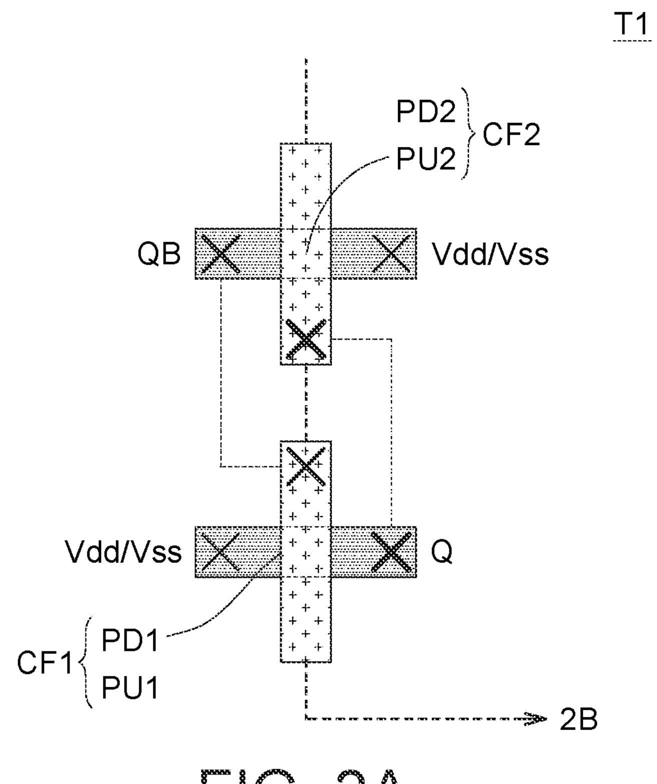
FIG. 2A shows the first CFET and the second CFET formed in a first tier according to one embodiment.
Figure 2B:
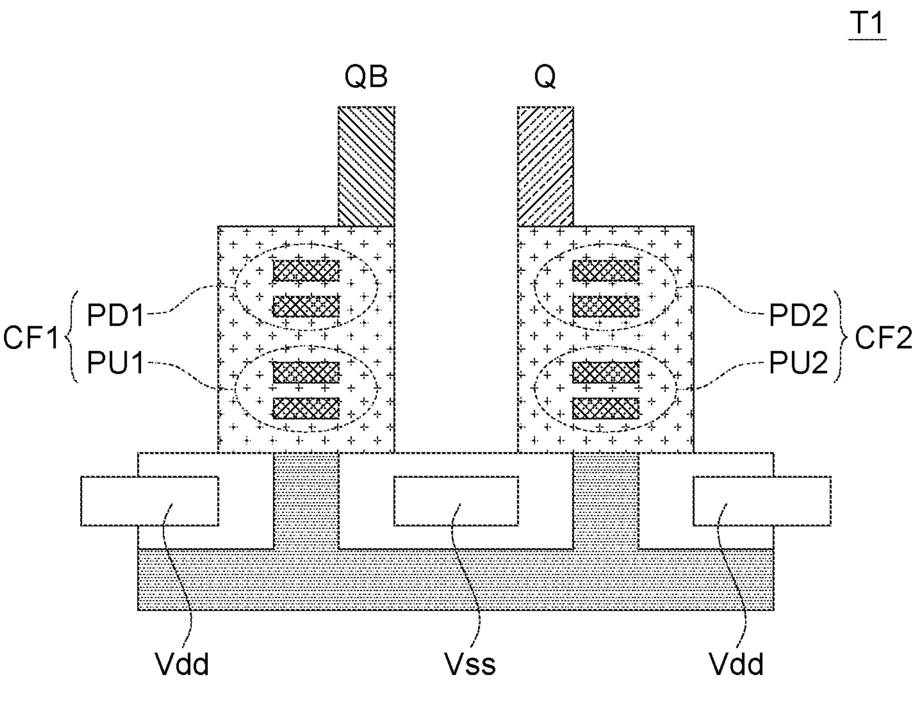
FIG. 2B shows a sectional view of FIG. 2A along a section line 2B passing through the gates of the first CFET and the second CFET.

In the presented invention, a two-tier structure is provided for saving space and connecting these components more efficiently. Please refer to FIGS. 2A to 2B. FIG. 2A shows the first CFET CF1 and the second CFET CF2 formed in a first tier T1 according to one embodiment. FIG. 2B shows a sectional view of FIG. 2A along a section line 2B passing through the gates of the first CFET CF1 and the second CFET CF2. In the first tier T1, only the cross-coupled inventers, i.e. the first CFET CF1 and the second CFET CF2, are formed. The first CFET CF1 and the second CFET CF2 are located at the same column. The first CFET CF1 and the second CFET CF2 are, for example, nanosheets structures. As shown in FIG. 2B, all four spaces are used for arranging the first pull up transistor PU1, the first pull down transistor PD1, the second pull up transistor PU1 and the second pull down transistor PD2. No transistor is needed to be removed, so the area is saved.

Figure 3A:
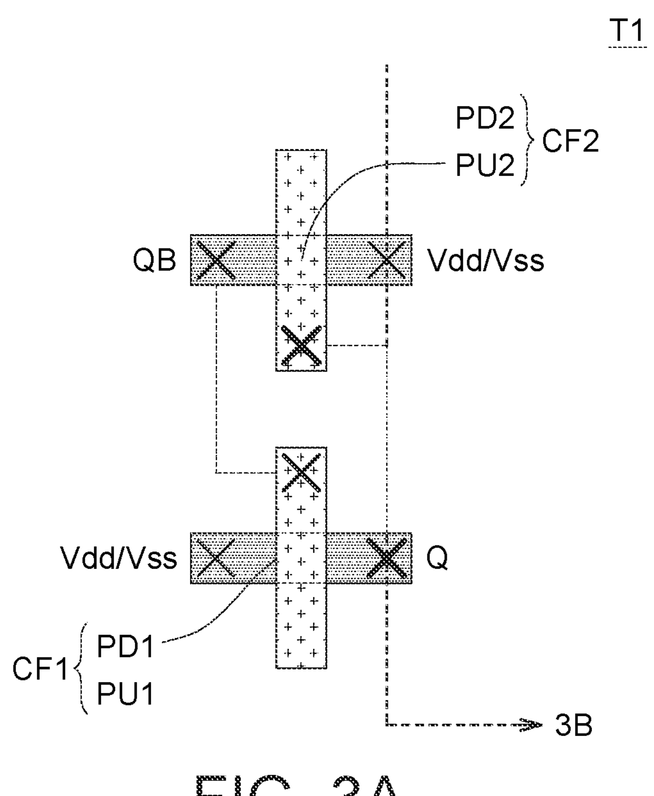
FIG. 3A shows the first CFET and the second CFET formed in the first tier according to one embodiment.
Figure 3B:
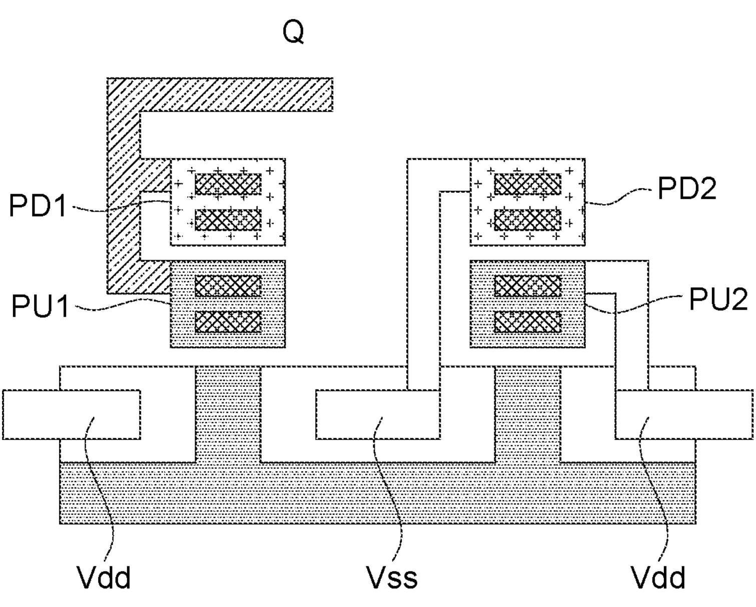
FIG. 3B shows a sectional view of FIG. 3A along a section line 3B passing through the drains of the first CFET and the sources of the second CFET.

Please referring to FIG. 3A to 3B. FIG. 3A shows the first CFET CF1 and the second CFET CF2 formed in the first tier T1 according to one embodiment. FIG. 3B shows a sectional view of FIG. 3A along a section line 3B passing through the drains of the first CFET CF1 and the sources of the second CFET CF2. The drain of the first pull up transistor PU1 and the drain of the first pull down transistor PD1 are connected to the first path Q. The source of the second pull up transistor PU2 is connected to the supply voltage Vdd and the source of the second pull down transistor PD2 is connected to the ground voltage Vss.

Figure 4A:
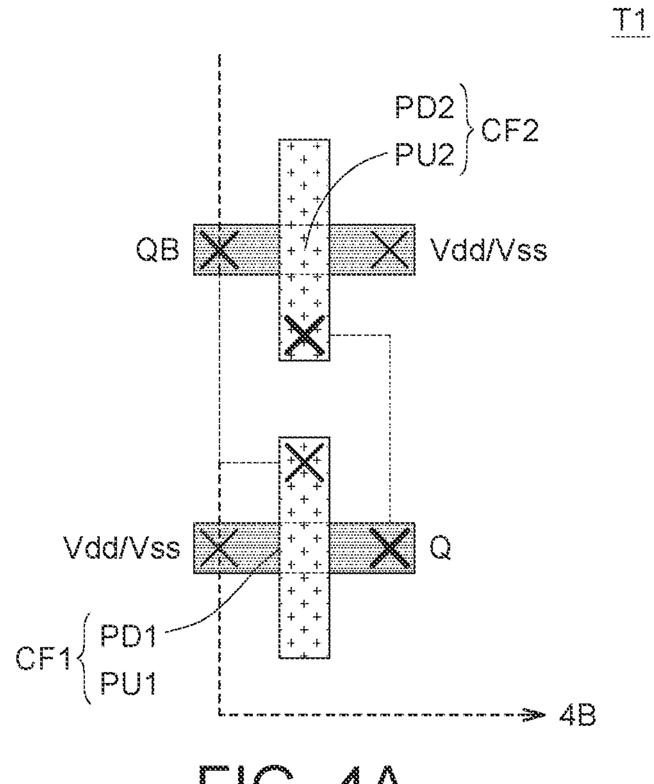
FIG. 4A shows the first CFET and the second CFET formed in the first tier according to one embodiment.
Figure 4B:
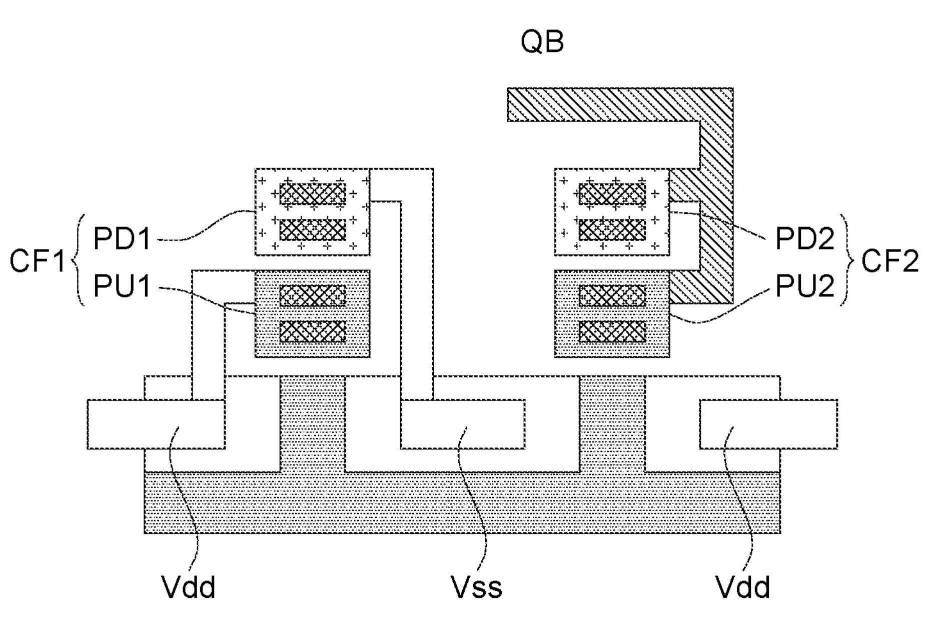
FIG. 4B shows a sectional view of FIG. 4A along a section line 4B passing through the sources of the first CFET and the drains of the second CFET.

Please referring to FIG. 4A to 4B. FIG. 4A shows the first CFET CF1 and the second CFET CF2 formed in the first tier T1 according to one embodiment. FIG. 4B shows a sectional view of FIG. 4A along a section line 4B passing through the sources of the first CFET CF1 and the drains of the second CFET CF2. The drain of the second pull up transistor PU2 and the drain of the second pull down transistor PD2 are connected to the second path QB. The source of the first pull up transistor PU1 is connected to the supply voltage Vdd and the source of the first pull down transistor PD1 is connected to the ground voltage Vss.

As shown in FIGS. 3B and 4B, only the first path Q and the second path QB appear above the first CFET CF1 and the second CFET CF2. The routings to the supply voltage Vdd and the ground voltage Vss are downward. The word line WL, the first bit line BL and the second bit line BLB do not appear in the first tier T1, so the routing congestion is much less.

Figure 5:
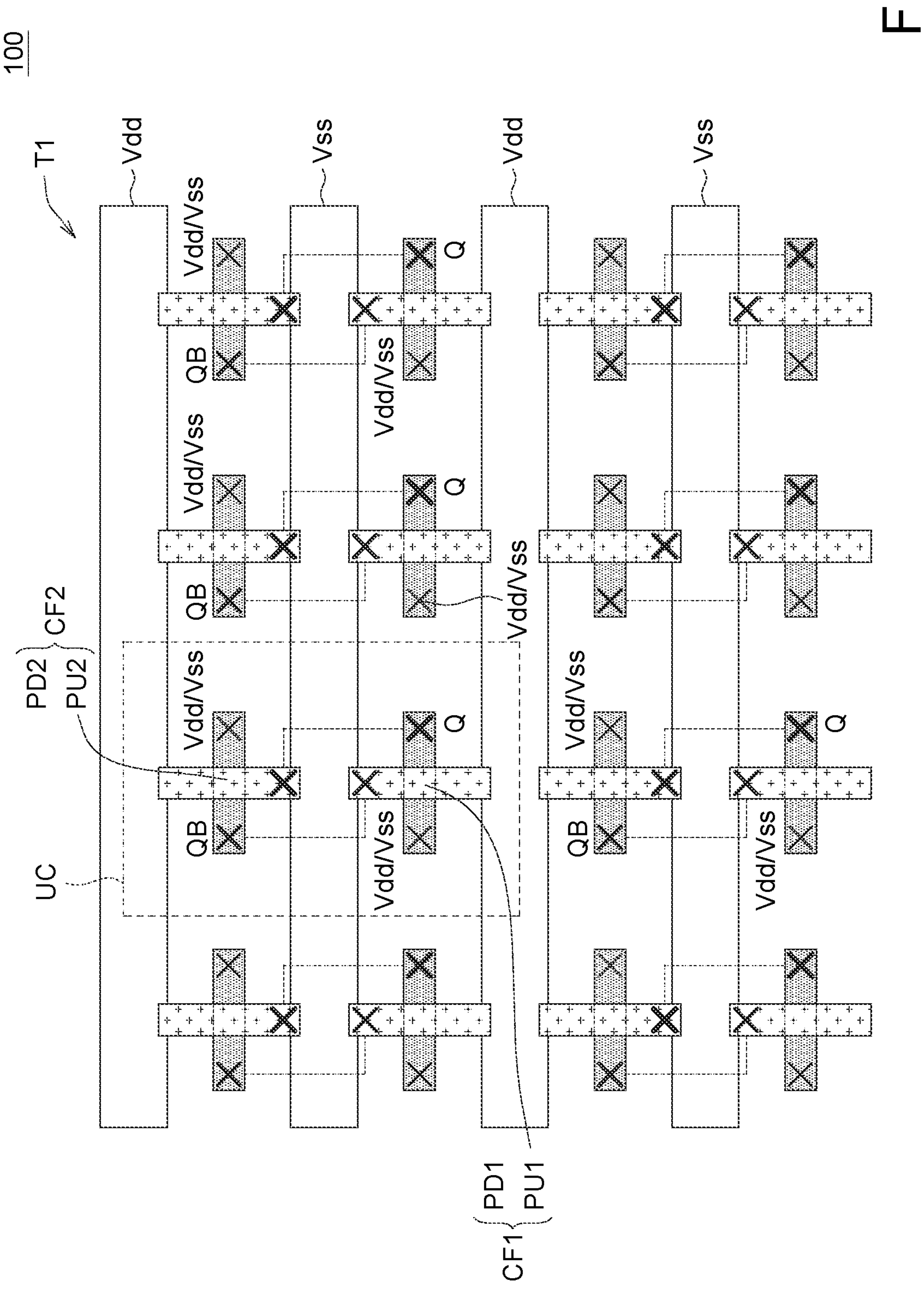
FIG. 5 shows a top view of a plurality unit cells of the SRAM according to one embodiment.

Please refer to FIG. 5, which shows a top view of a plurality of unit cells UC of the SRAM 100 according to one embodiment. The unit cells UC in the first tier T1 are arranged in an array. As shown in FIG. 5, the unit cells UC are repeated periodically in each row and in each column.

Figure 6:
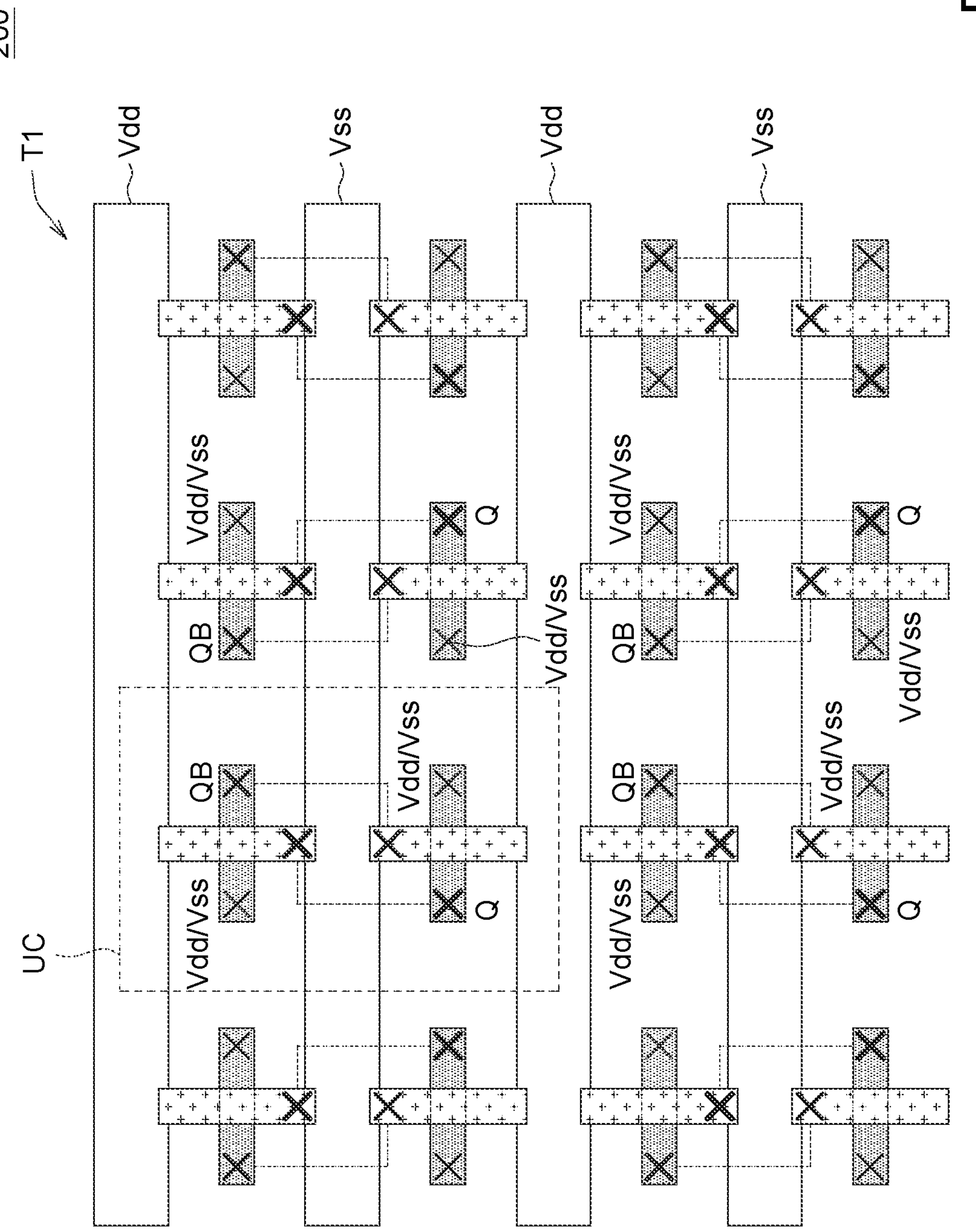
FIG. 6 shows a top view of a plurality unit cells of the SRAM according to another embodiment.

Please refer to FIG. 6, which shows a top view of a plurality of unit cells UC of the SRAM 200 according to another embodiment. In the embodiment described in FIG. 6, the unit cells UC in the even columns are mirrored along the vertical axis, so they are symmetric with respect to the unit cells in the odd columns.

Figure 7:
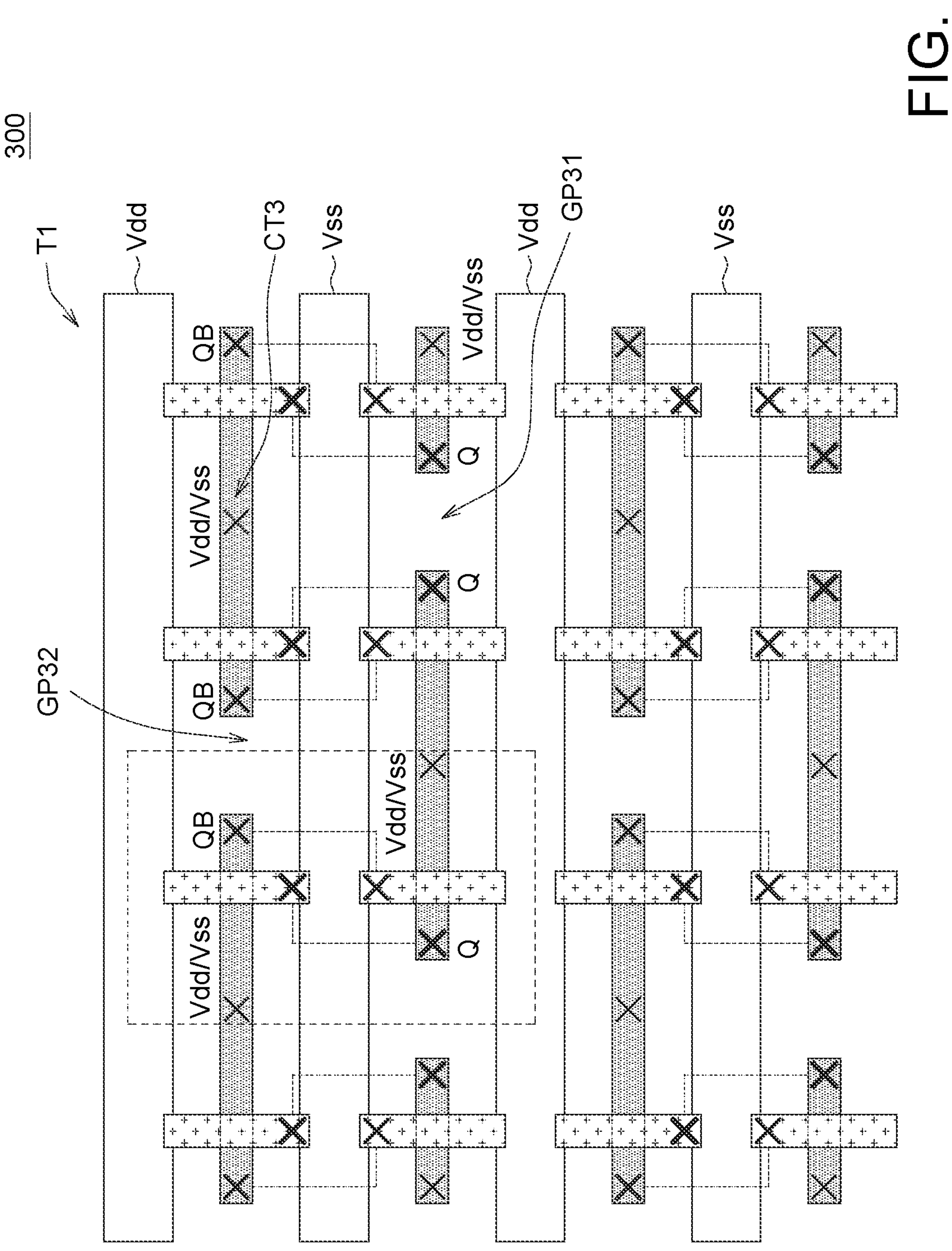
FIG. 7 shows a top view of a plurality unit cells of the SRAM according to another embodiment.

Please refer to FIG. 7, which shows a top view of a plurality unit cells UC of the SRAM 300 according to another embodiment. In the embodiment described in FIG. 7, the unit cells UC in the even columns are mirrored along the vertical axis, so they are symmetric with respect to the unit cells in the odd columns. The adjacent unit cells UC share the same contact CT3 for connecting to the supply voltage Vdd or the ground voltage Vss. There is a first isolation gap GP31 located between two columns to isolate two first paths Q, and there is a second isolation gap GP32 located between two columns to isolate two second paths QB.

Figure 8A:
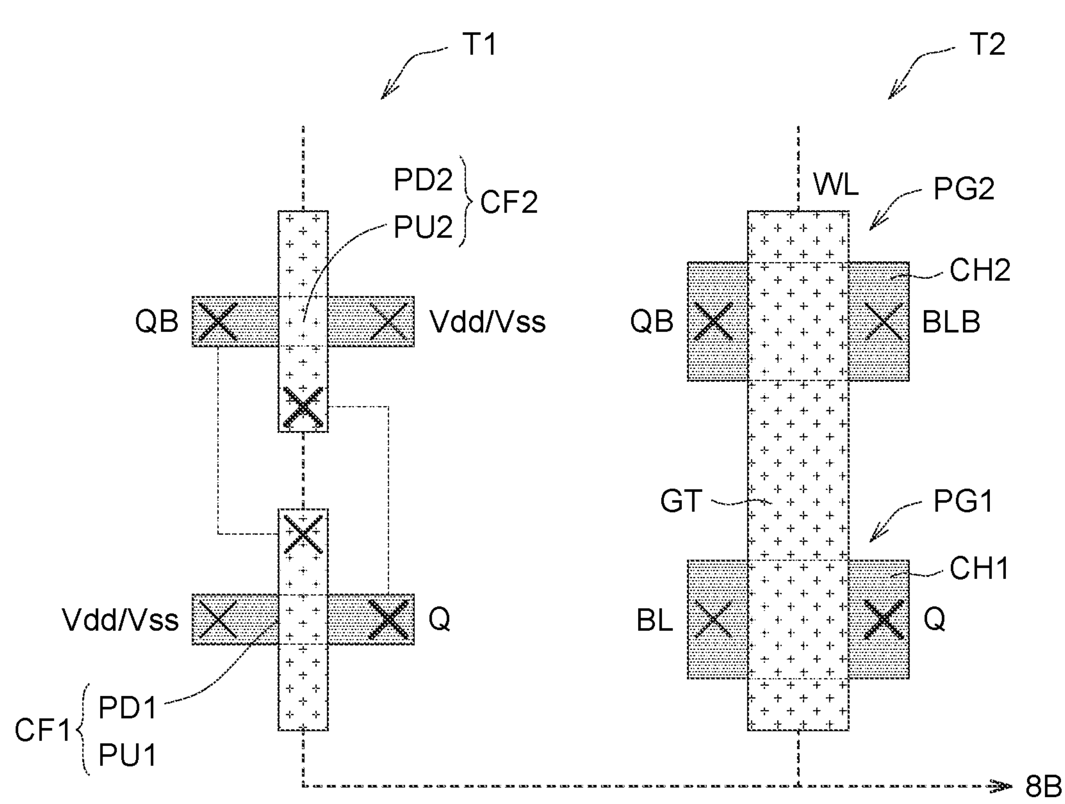
FIG. 8A shows the first CFET and the second CFET of an SRAM formed in the first tier and the first pass gate transistor and the second pass gate transistor of the SRAM formed in a second tier according to another embodiment.
Figure 8B:
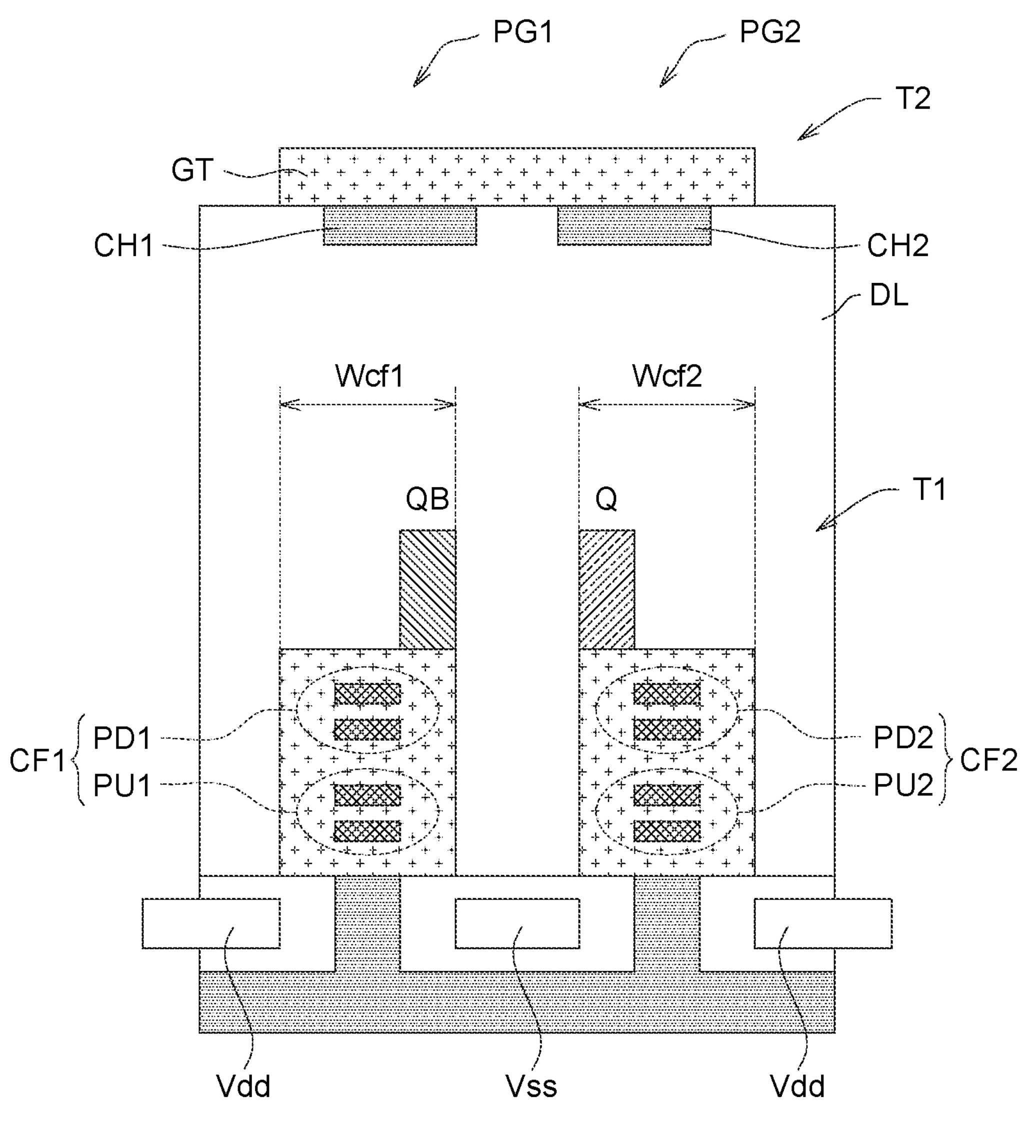
FIG. 8B shows a sectional view of FIG. 8A along a section line 8B passing through the gates of the first CFET and the second CFET and the gates of the first pass gate transistor and the second pass gate transistor.

Please refer to FIG. 8A to 8B. FIG. 8A shows the first CFET CF1 and the second CFET CF2 of an SRAM 400 formed in the first tier T1 and the first pass gate transistor PG1 and the second pass gate transistor PG2 of the SRAM 400 formed in a second tier T2 according to another embodiment. FIG. 8B shows a sectional view of FIG. 8A along a section line 8B passing through the gates of the first CFET CF1 and the second CFET CF2 and the gates of the first pass gate transistor PG1 and the second pass gate transistor PG2. In the second tier T2, only the first pass gate transistor PG1 and the second pass gate transistor PG2 are formed. The first pass gate transistor PG1 and the second pass gate transistor PG2 are, for example, thin film transistors each of which has a channel, i.e. a first channel layer CH1 and a second channel layer CH2. The material of the first channel layer CH1 and the second channel layer CH2 may be an oxide semiconductor, e.g., InGaZnOx (IGZO), InWO, $In_2O_3$, $Ga_2O_3$, InSnO (ITO), or the combination thereof. The thin film transistors having oxide semiconductor channels can be processed at low temperature, and can have low leakage.

As shown in FIG. 8B, the first pass gate transistor PG1 is disposed above and overlaps the first CFET CF1, the second pass gate transistor PG2 is disposed above and overlaps the second the second CFET CF2. The first channel layer CH1 and the second channel layer CH2 are located on a dielectric layer DL covering the first CFET CF1 and the second CFET CF2. The first pass gate transistor PG1 and the second pass gate transistor PG2 share one gate GT. The gate GT is located above the first channel layer CH1 and the second channel layer CH2.

Figure 9A:
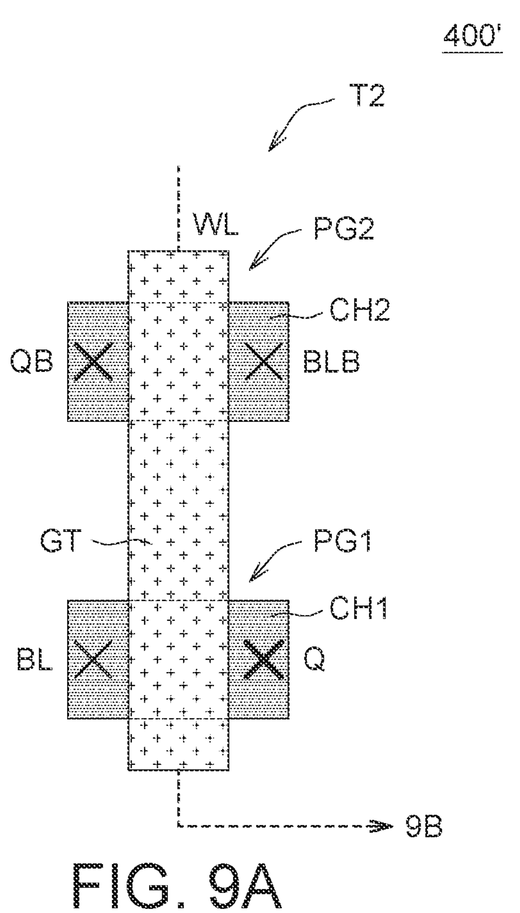
FIG. 9A shows the first pass gate transistor and the second pass gate transistor of the SRAM formed in the second tier according to another embodiment.
Figure 9B:
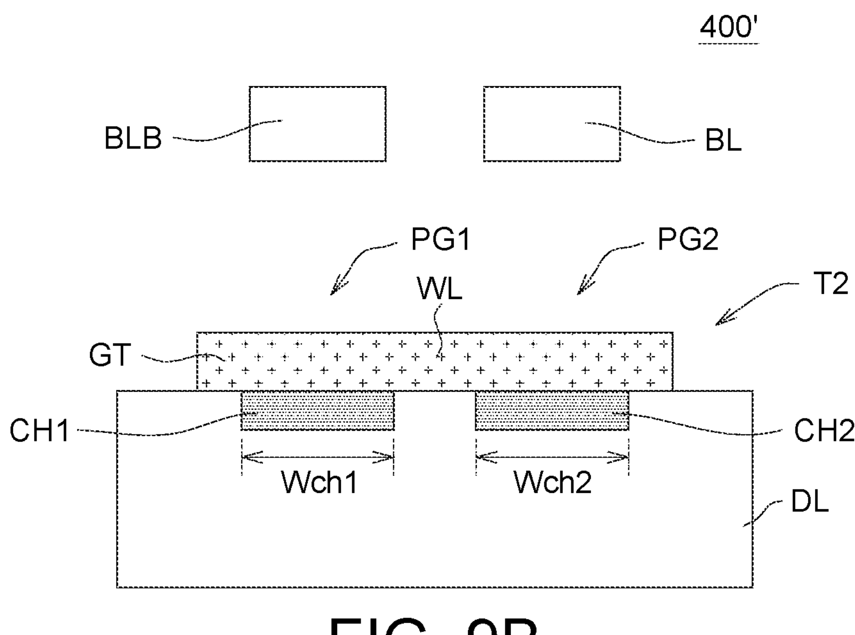
FIG. 9B shows a sectional view of FIG. 9A along a section line 9B passing through the gates of the first pass gate transistor and the second pass gate transistor.

Please refer FIGS. 9A to 9B. FIG. 9A shows the first pass gate transistor PG1 and the second pass gate transistor PG2 of the SRAM 400' formed in the second tier T2 according to another embodiment. FIG. 9B shows a sectional view of FIG. 9A along a section line 9B passing through the gates of the first pass gate transistor PG1 and the second pass gate transistor PG2. Because the space below the gate GT is only occupied by the first channel layer CH1 and the second channel layer CH2, the width Wch1 of the first channel layer CH1 can be larger than the width Wcf1 (shown in FIG. 8B) of the first CFET CF1 and the width Wch2 of the second channel layer CH2 can be larger than the width Wcf2 (shown in FIG. 8B) of the second CFET CF2. The width Wch1 and the width Wch2 can be used to tune the drive strength of the first pass gate transistor PG1 and the second pass gate transistor PG2, respectively. In one embodiment, the width Wch1 of the first channel layer CH1 may be substantially identical to the width Wch2 of the second channel layer CH2. In another embodiment, the width Wch1 of the first channel layer CH1 may be different from the width Wch2 of the second channel layer CH2.

Figure 10A:
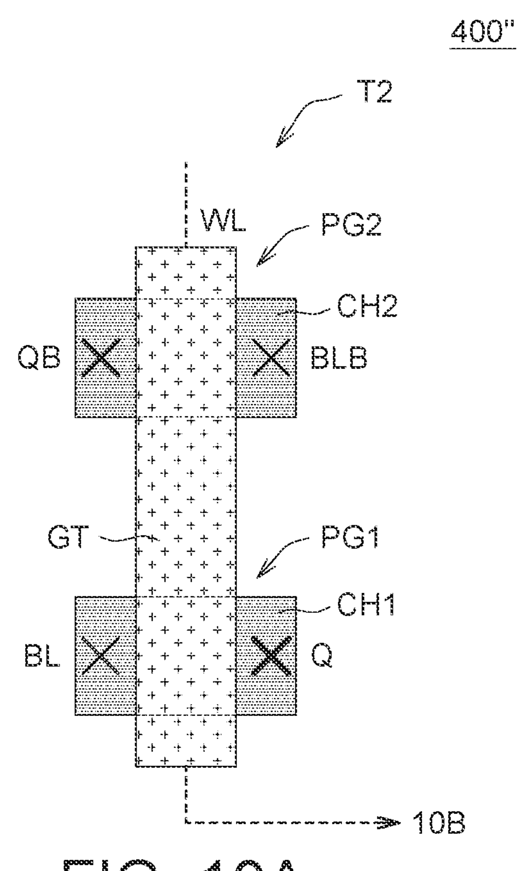
FIG. 10A shows the first pass gate transistor and the second pass gate transistor of the SRAM formed in the second tier according to another embodiment.
Figure 10B:
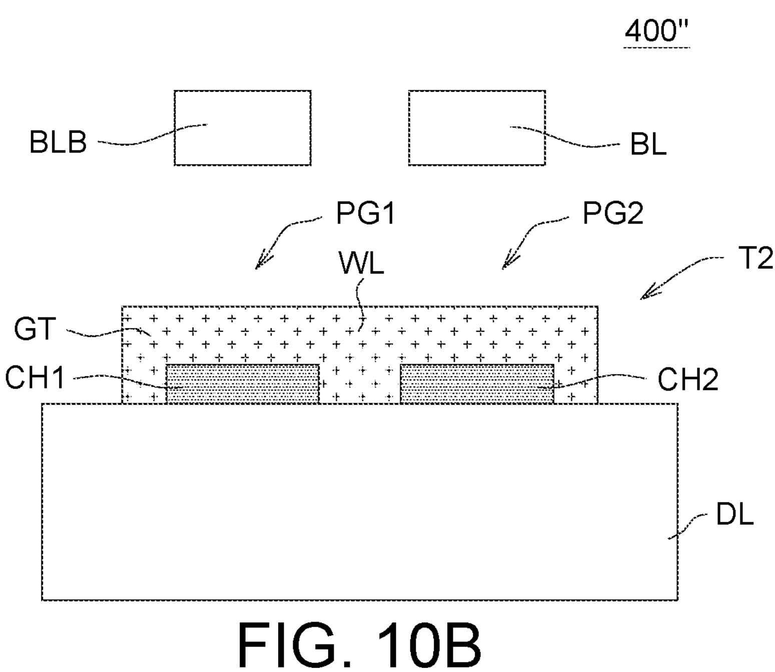
FIG. 10B shows a sectional view of FIG. 10A along a section line 10B passing through the gates of the first pass gate transistor and the second pass gate transistor.

Please refer FIGS. 10A to 10B. FIG. 10A shows the first pass gate transistor PG1 and the second pass gate transistor PG2 of the SRAM 400" formed in the second tier T2 according to another embodiment. FIG. 10B shows a sectional view of FIG. 10A along a section line 10B passing through the gates of the first pass gate transistor PG1 and the second pass gate transistor PG2. As shown in FIG. 10B, the first channel layer CH1 and the second channel layer CH2 are embedded in the gate GT. The material of the gate GT may include, for example, silicon dioxide, silicon nitride, high-K dielectrics, such as Al2O3, HfO2, and metals, such as TiN, TaN, TiAl, W.

Figure 11A:
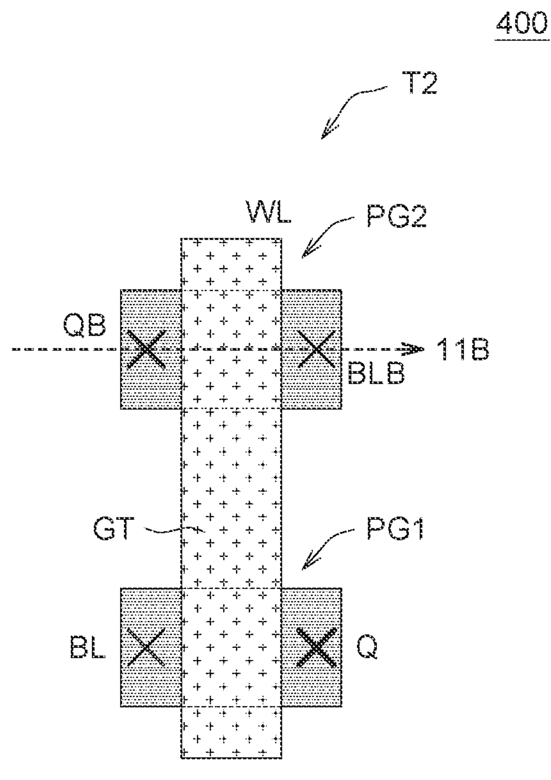
FIG. 11A shows the first pass gate transistor and the second pass gate transistor of the SRAM formed in the second tier according to the embodiment described in FIG. 8A.
Figure 11B:
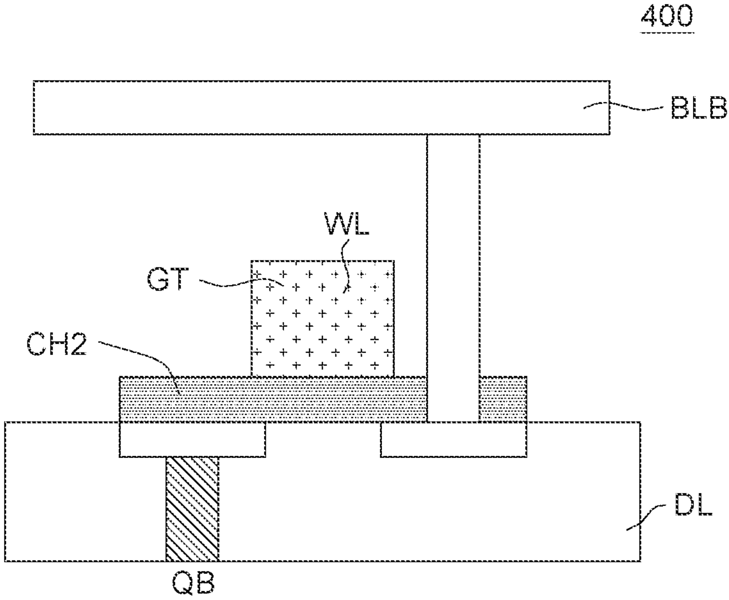
FIG. 11B shows a sectional view of FIG. 11A along a section line 11B passing through the second channel layer of the second pass gate transistor.

Please refer FIGS. 11A to 11B. FIG. 11A shows the first pass gate transistor PG1 and the second pass gate transistor PG2 of the SRAM 400 formed in the second tier T2 according to the embodiment described in FIG. 8A. FIG. 11B shows a sectional view of FIG. 11A along a section line 11B passing through the second channel layer CH2 of the second pass gate transistor PG2. As shown in FIG. 11B, the gate GT is disposed above the second channel layer CH2, and two source/drain metals M21, M22 are located below and embedded in the dielectric layer DL. The gate GT and the source/drain metals M21, M22 are located at different sides of the second channel layer CH2, so the need for gate spacers is avoided. The source/drain metal M21 is connected to the second path QB using. Connections between the pass gate transistors, the second path QB and the first path Q are, for example, though vias. The source/drain metal M22 is connected to the second bit line BLB by a via passing through the second channel layer CH2.

Figure 12:
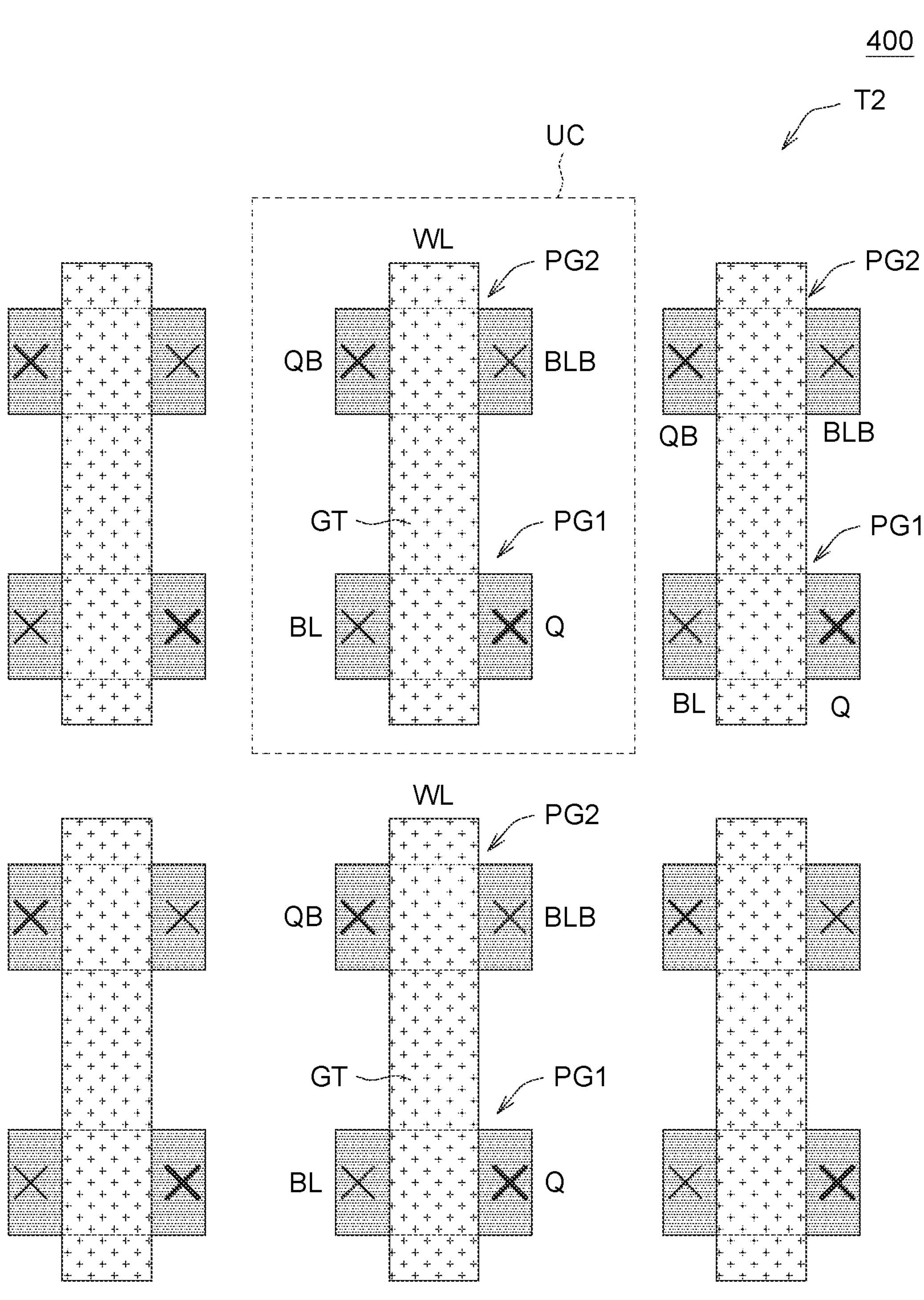
FIG. 12 shows a top view of a plurality unit cells of the SRAM according to one embodiment.

Please refer to FIG. 12, which shows a top view of a plurality of unit cells UC of the SRAM 400 according to one embodiment. The unit cells UC in the second tier T2 are arranged in an array. As shown in FIG. 12, the unit cells UC are repeated periodically in each row and in each column. The first pass gate transistor PG1 and the second pass gate transistor PG2 are located in the same column. The gates GT may be cut between unit cells and routed to BEOL lines running along the columns.

Figure 13:
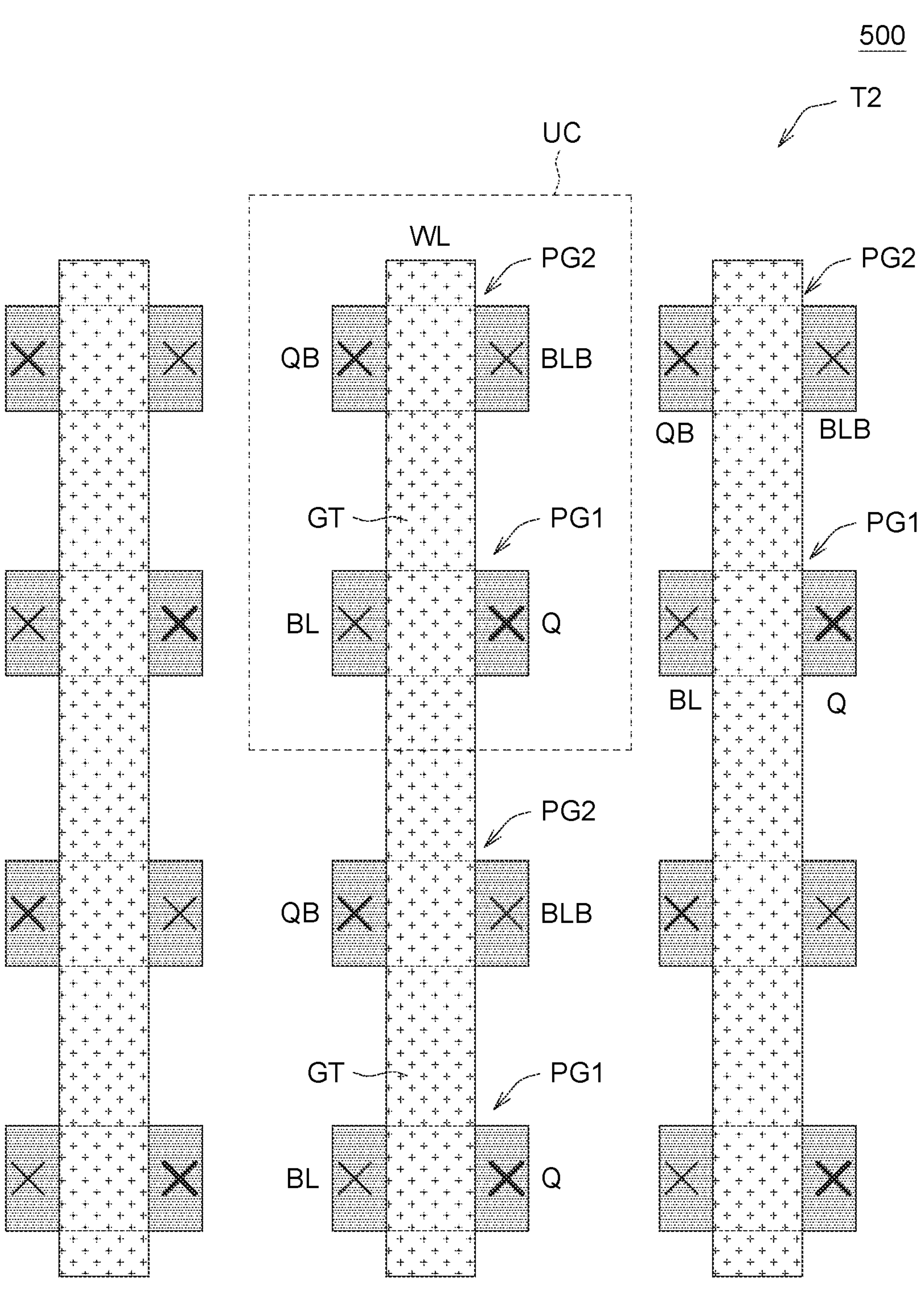
FIG. 13 shows a top view of a plurality unit cells of the SRAM according to another embodiment.

Please refer to FIG. 13, which shows a top view of a plurality unit cells UC of the SRAM 500 according to another embodiment. In the embodiment described in FIG. 13, the gates GT in each column are not cut, and the gates GT in each column are used as a continuous word line WL. By not cutting the gates GT the resistance of the word lines WL can be reduced. Furthermore, less vias to the gates are needed.

Figure 14:
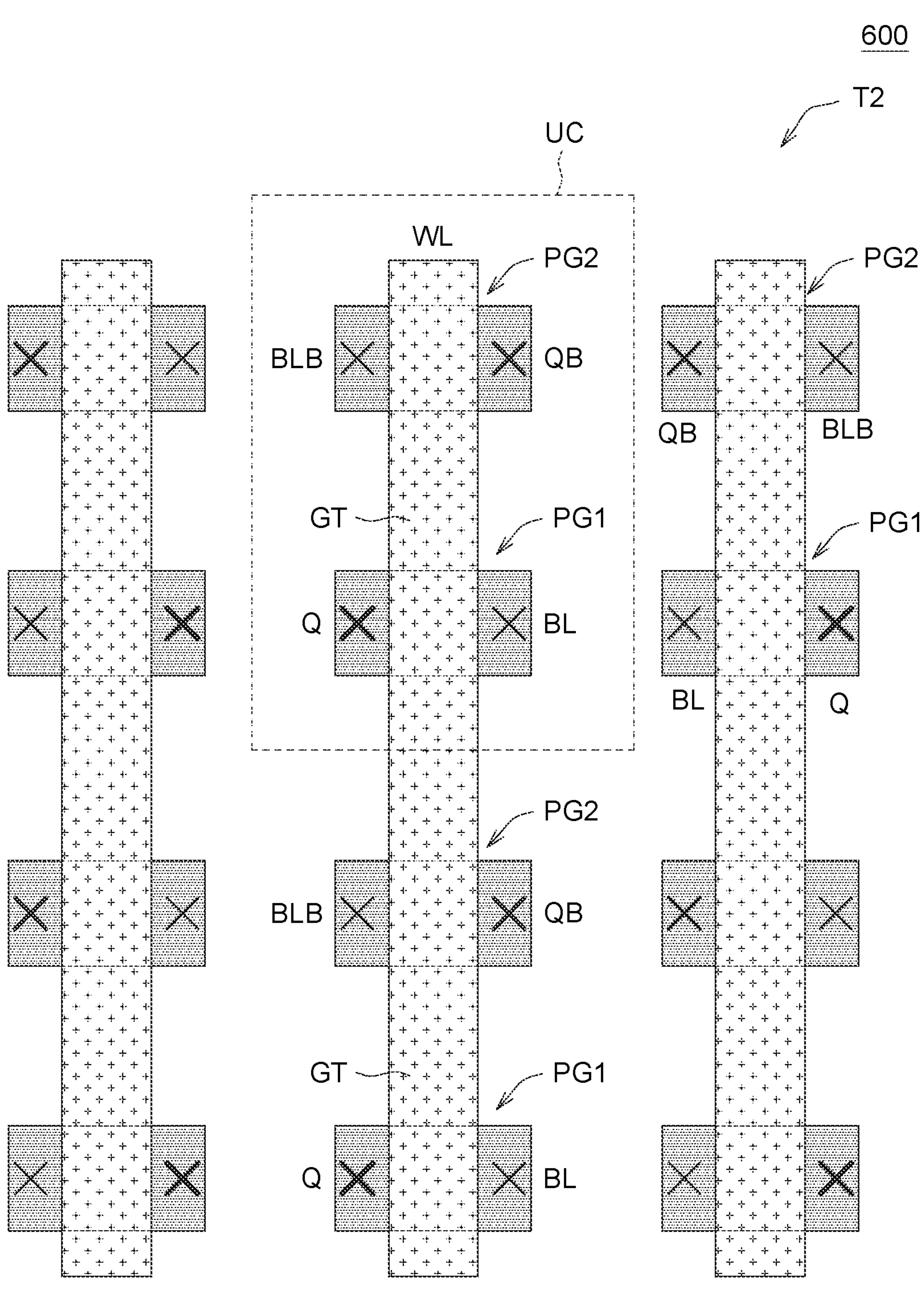
FIG. 14 shows a top view of a plurality unit cells of the SRAM according to another embodiment.

Please refer to FIG. 14, which shows a top view of a plurality unit cells UC of the SRAM 600 according to another embodiment. In the embodiment described in FIG. 14, the unit cells UC in the even columns are mirrored along the vertical axis, so the unit cells in the even columns are symmetric to the unit cells UC in the odd columns.

Figure 15:
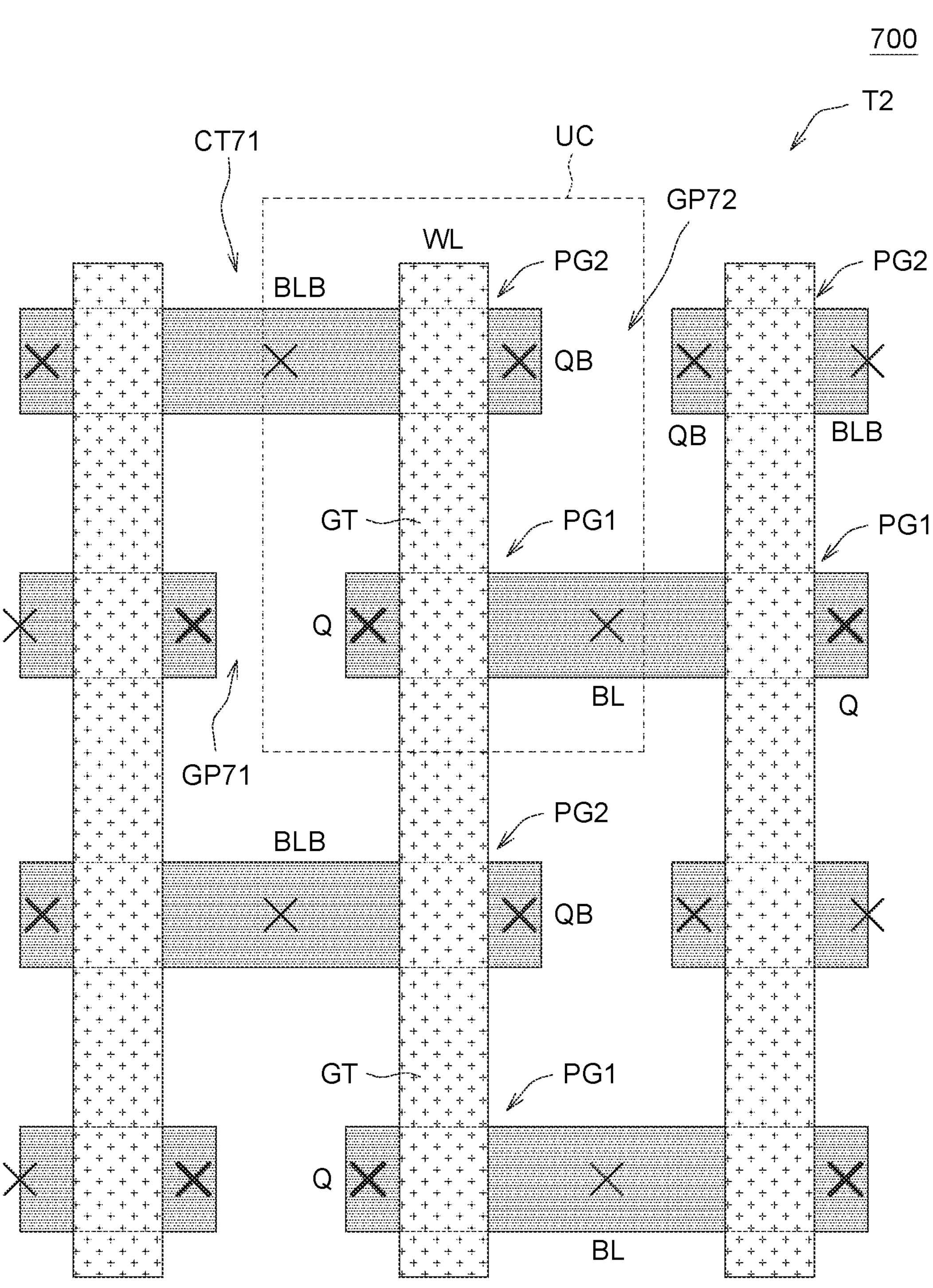
FIG. 15 shows a top view of a plurality unit cells of the SRAM according to another embodiment.

Please refer to FIG. 15, which shows a top view of a plurality unit cells UC of the SRAM 700 according to another embodiment. In the embodiment described in FIG. 15, the unit cells UC in the even columns are symmetric to the unit cells UC in the odd columns. The adjacent unit cells UC share the same contact CT7 for connecting to the second bit line BLB or the first bit line BL. There is a first isolation gap GP71 located between two columns to isolate two first path Q, and there is a second isolation gap GP72 located between two columns to isolate two second path QB.

Figure 16A:
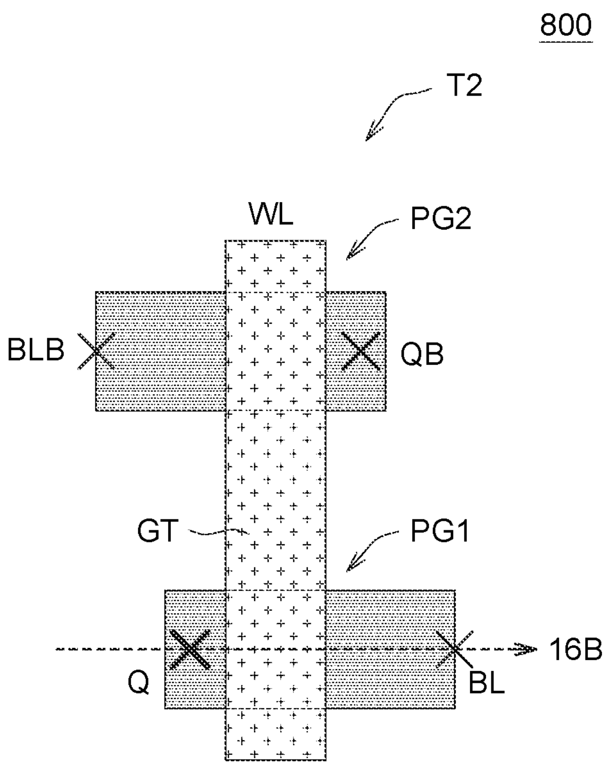
FIG. 16A shows the first pass gate transistor and the second pass gate transistor of an SRAM formed in the second tier according to another embodiment.
Figure 16B:
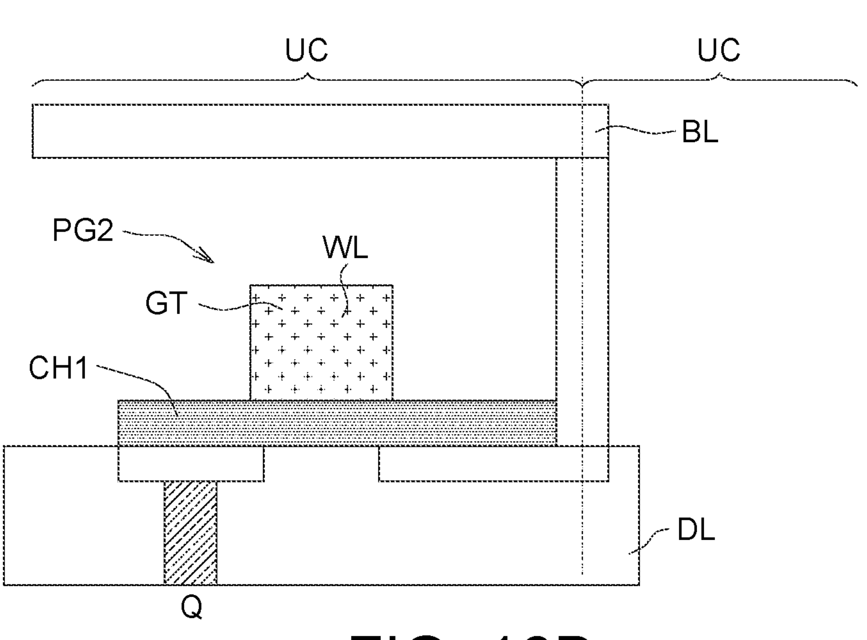
FIG. 16B shows a sectional view of FIG. 16A along a section line passing through the first pass gate transistor.

Please refer to FIG. 16A to 16B. FIG. 16A shows the first pass gate transistor PG1 and the second pass gate transistor PG2 of an SRAM 800 formed in the second tier T2 according to another embodiment. FIG. 16B shows a sectional view of FIG. 16A along a section line 16B passing through the first pass gate transistor PG1. In the second tier T2, the first bit line BL runs parallel to the first channel layer CH1. The second pass gate transistor PG2 is connected to the first bit line BL by a via. Two adjacent unit cells UC share one via to connect the first bit line BL.

Figure 17A:
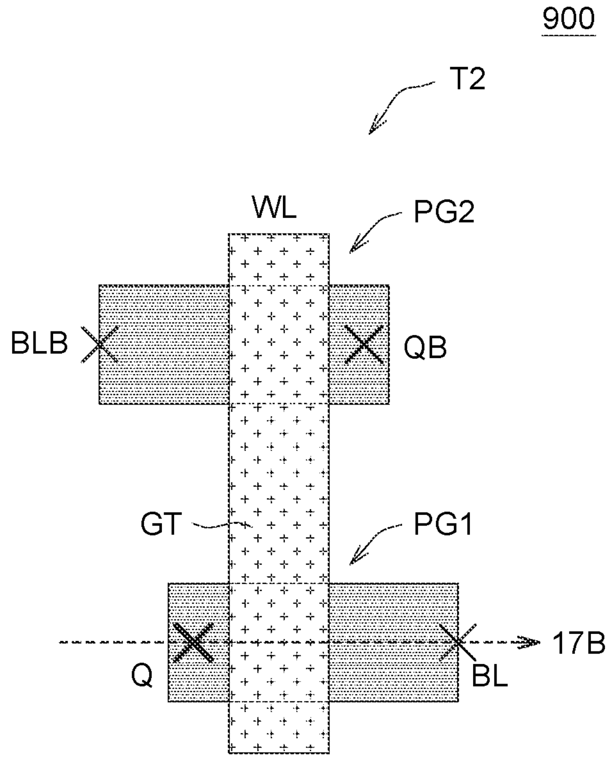
FIG. 17A shows the first pass gate transistor and the second pass gate transistor of the SRAM formed in the second tier according to another embodiment.
Figure 17B:
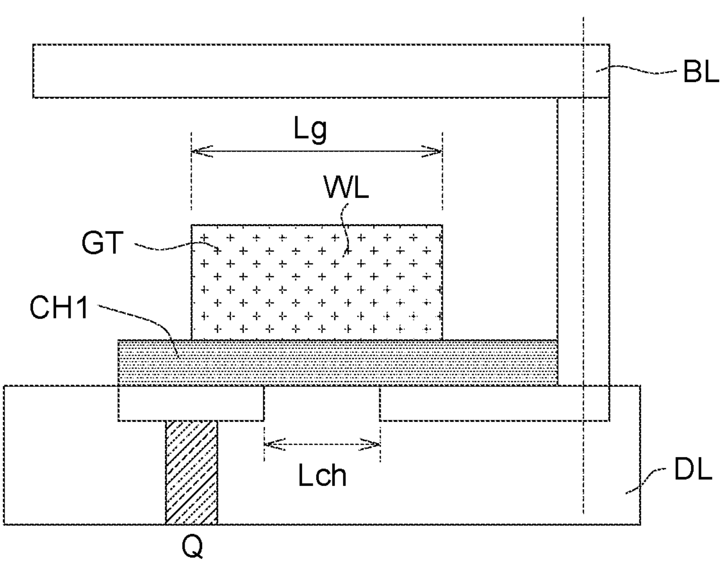
FIG. 17B shows a sectional view of FIG. 17A along a section line 17B passing through the first pass gate transistor.

Please refer FIGS. 17A to 17B. FIG. 17A shows the first pass gate transistor PG1 and the second pass gate transistor PG2 of the SRAM 900 formed in the second tier T2 according to another embodiment. FIG. 17B shows a sectional view of FIG. 17A along a section line 17B passing through the first pass gate transistor PG1. Because the space above first channel layer CH1 is only occupied by the gate GT, the length Lg of the gate GT can be quite larger than the channel length Lch of the first channel layer CH1.

Figure 18A:
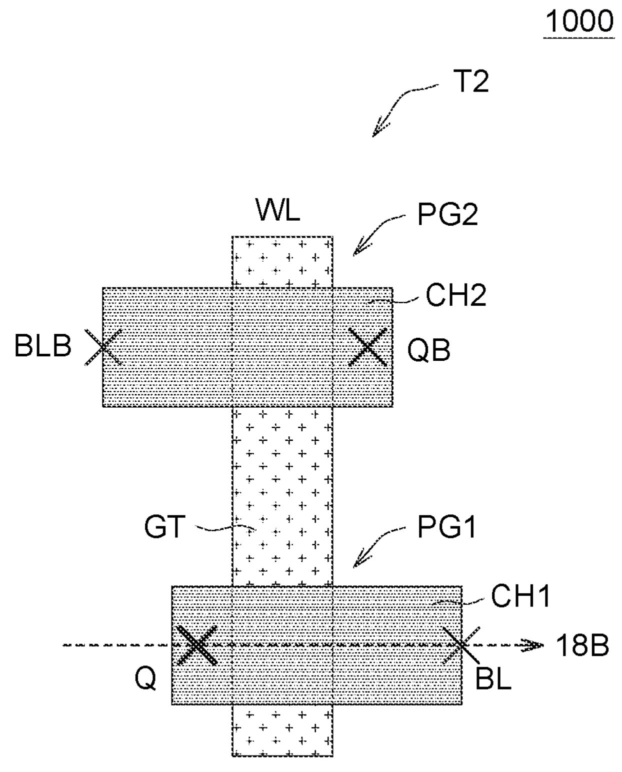
FIG. 18A shows the first pass gate transistor and the second pass gate transistor of the SRAM formed in the second tier according to another embodiment.
Figure 18B:
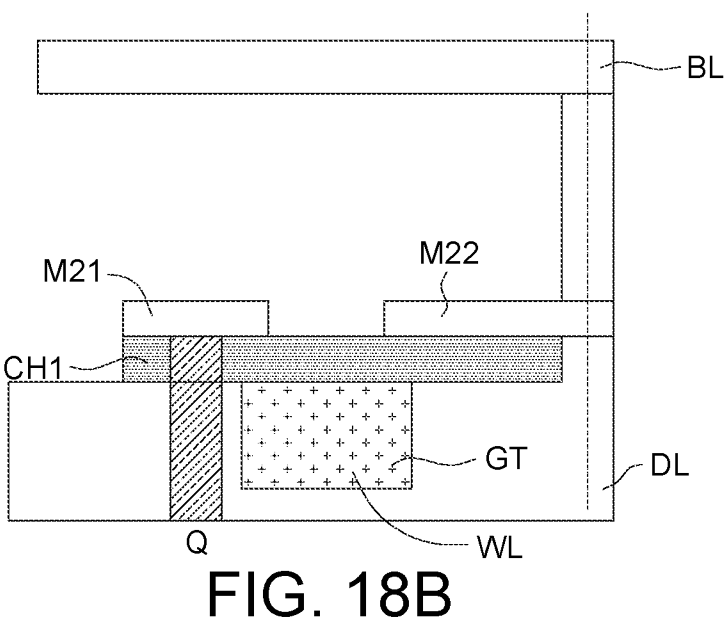
FIG. 18B shows a sectional view of FIG. 18A along a section line 18B passing through the first pass gate transistor.

Please refer FIGS. 18A to 18B. FIG. 18A shows the first pass gate transistor PG1 and the second pass gate transistor PG2 of the SRAM 1000 formed in the second tier T2 according to another embodiment. FIG. 18B shows a sectional view of FIG. 18A along a section line 18B passing through the first pass gate transistor PG1. As shown in FIG. 18B, the gate GT is disposed below the first channel layer CH1 and embedded in the dielectric layer DL, and two source/drain metals M21, M22 are located above the first channel layer CH1. The gate GT and the source/drain metals M21, M22 are located at different sides of the first channel layer CH1, hence the need for gate spacer is avoided. The source/drain metal M21 is connected to the second path QB by a via passing through the first channel layer CH1. The source/drain metal M22 is connected to the first bit line BL by a via.

Figure 19:
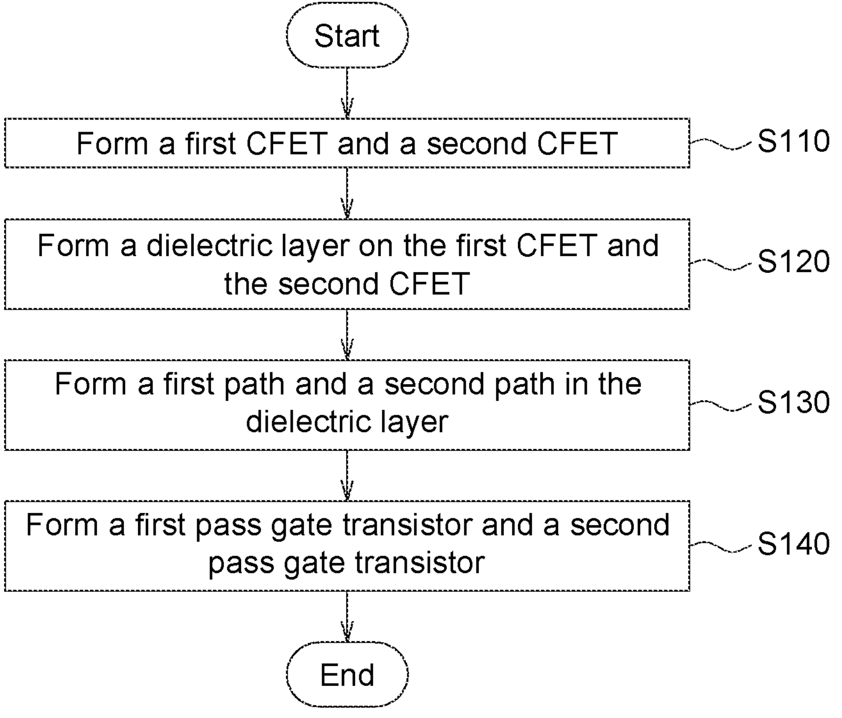
FIG. 19 shows a flowchart of a manufacturing method of the static random access memory according to one embodiment.
Figure 20A:
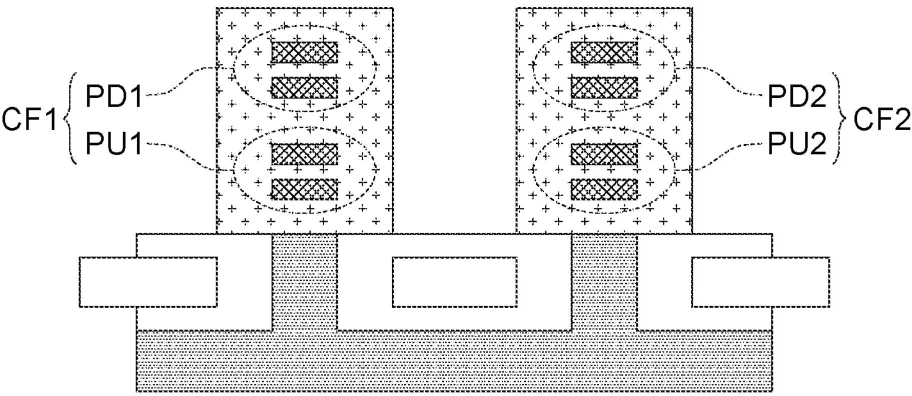
FIGS. 20A to 20D illustrate the steps in FIG. 19.
Figure 20B:
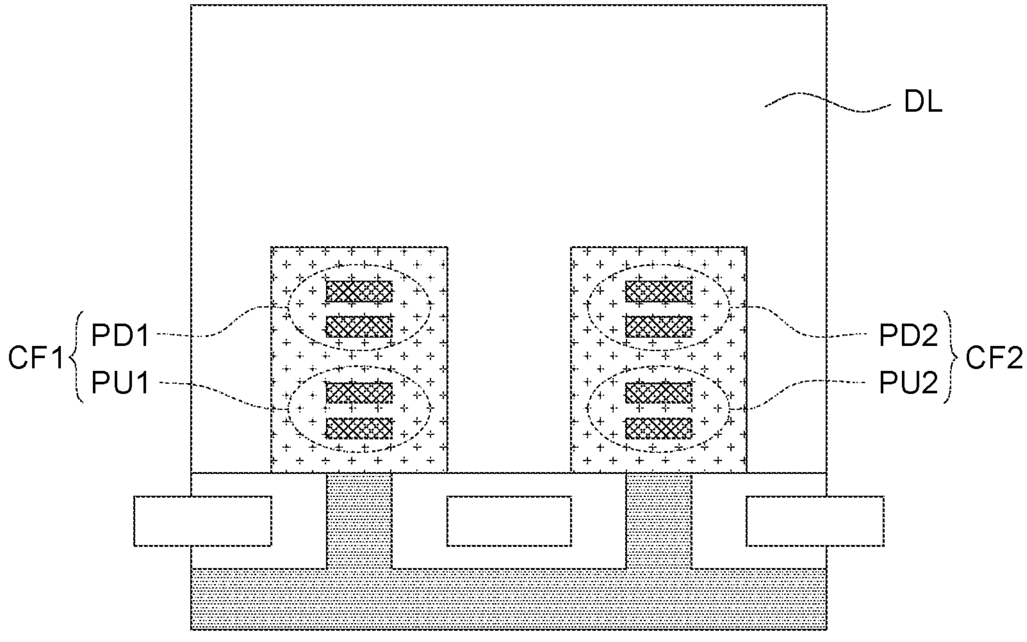
Figure 20C:
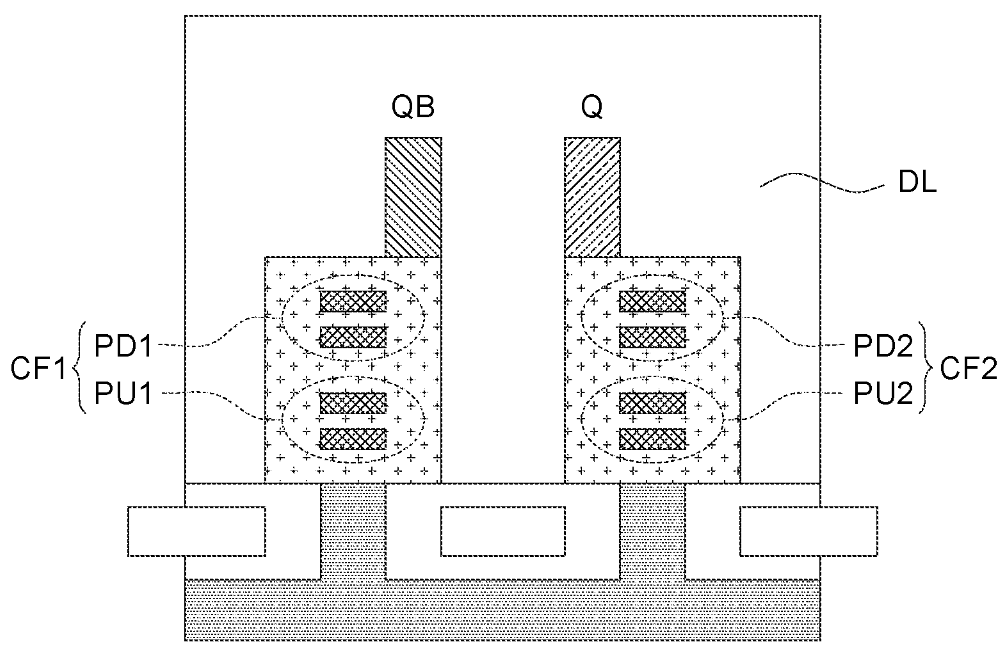
Figure 20D:
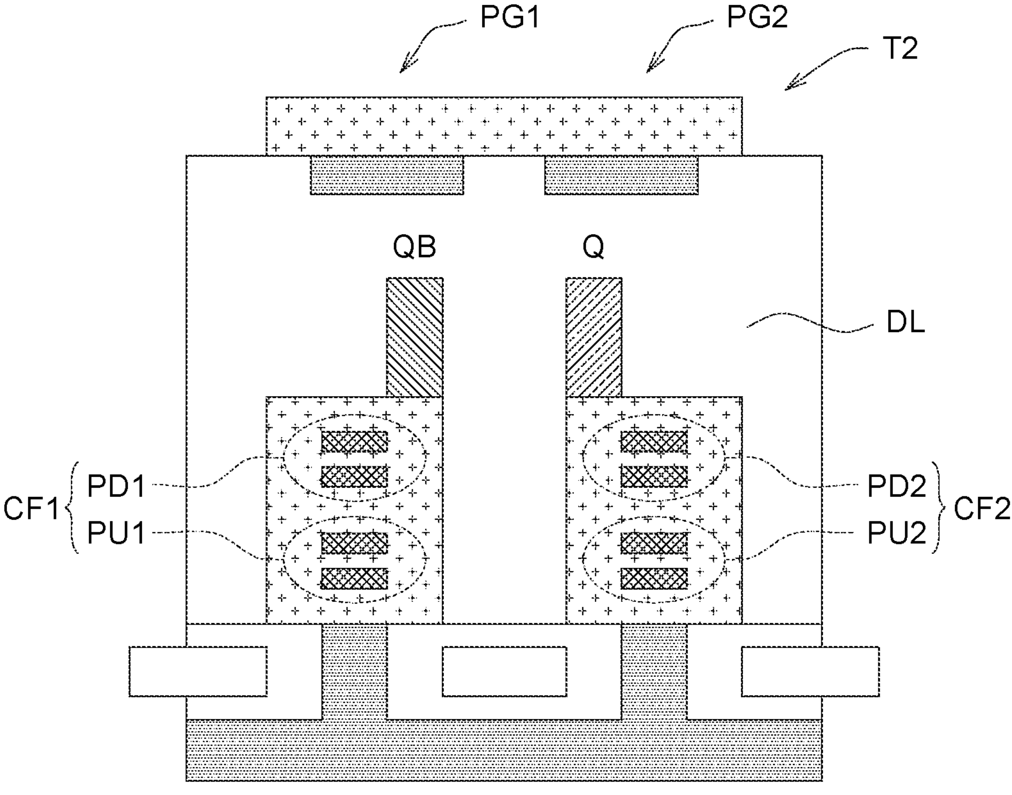

Please refer to FIG. 19 and FIGS. 20A to 20D. FIG. 19 shows a flowchart of a manufacturing method of the static random access memory 400 according to one embodiment. FIGS. 20A to 20D illustrate the steps in FIG. 19. In step S110, the first CFET CF1 and the second CFET CF2 are formed. Then, in step S120, the dielectric layer DL is formed on the first CFET CF1 and the second CFET CF2.

Afterwards, in step S130, the first path Q and the second path QB are formed in the dielectric layer DL. In this step, the first path Q is connected to the first CFET CF1 and the second path QB is connected the second CFET CF2.

Next, the first pass gate transistor PG1 and the second pass gate transistor PG2 are formed. In this step, the first pass gate transistor PG1 is connected to the first path Q and the second pass gate transistor PG2 is connected to the second path QB.

Based on above, due to the two-tier structure, there is more room for the cross-contacts in the cross-coupled inventers, i.e. the first CFET CF1 and the second CFET CF2.

Moreover, in the second tier T2, only one or zero contact for the word line WL is needed for one cell of the SRAM 100, 200, 300, 400, 400', 400", 500, 600, 700, 800, 900, 1000.

The first pass gate transistor PG1 and the first pull down transistor PD1 are respectively located in different tiers, so the drive strength ratio of PD1 and PG1 can be separately optimized. Similarly, the second pass gate transistor PG2 and the second pull down transistor PD2 are respectively located in different tiers, so the drive strength ratio of the second pull down transistor PD2 and the second pass gate transistor PG2 can be separately optimized.

The first pull down transistor PD1, the first pull up transistor PU1, the second pull down transistor PD2 and the second pull up transistor PU2 are combined in two complementary pairs, and the first pass gate transistor PG1 and the second pass gate transistor PG2 are made individually, so there is no need to remove or disable any transistor.

Based on the above, in a static random access memory (SRAM), two CFETs are disposed in a first tier and two pass gate transistors are disposed in a second tier. The first pass gate transistor and the second pass gate transistor are stacked over the first CFET and the second CFET, so the SRAM has potentially higher density.

According to some embodiments, a static random access memory (SRAM) is provided. The SRAM includes a first complementary field effect transistor (CFET), a second CFET, a first pass gate transistor and a second pass gate transistor. The first CFET and the second CFET are disposed in a first tier. The first pass gate transistor is connected to the first CFET through a first path. The second pass gate transistor is connected to the second CFET through a second path. The first pass gate transistor and the second pass gate transistor are disposed in a second tier.

According to some embodiments, a static random access memory (SRAM) is provided. The SRAM includes a first complementary field effect transistor (CFET), a second CFET, a first pass gate transistor and a second pass gate transistor. The first CFET and the second CFET are disposed in a first tier. The first pass gate transistor is connected to the first CFET and located above the first CFET. The second pass gate transistor is connected to the second CFET and located above the second CFET. The first pass gate transistor and the second gate transistor are disposed in a second tier.

According to some embodiments, a manufacturing method of a static random access memory (SRAM) is provided. The manufacturing method of the SRAM includes the following steps. A first complementary field effect transistor (CFET) and a second CFET are formed. A dielectric layer is formed on the first CFET and the second CFET. A first path and a second path are formed in the dielectric layer. The first path is connected to the first CFET and the second path is connected the second CFET. A first pass gate transistor and a second pass gate transistor are formed. The first pass gate transistor is connected to the first path. The second pass gate transistor is connected to the second path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory, comprising:
- a first complementary field effect transistor (CFET); and
- a second CFET, wherein the first CFET and the second CFET are disposed in a first tier;
- a first pass gate transistor, connected to the first CFET through a first path; and
- a second pass gate transistor, connected to the second CFET through a second path, wherein the first pass gate transistor and the second pass gate transistor are disposed in a second tier;
- wherein in a plan view of the static random access memory, the first CFET is extended along an arrange line, the second CFET is extended along the arrange line, and the first path and the second path are located at different sides of the arrange line.

2. The static random access memory according to claim 1, wherein the first pass gate transistor and the second pass gate transistor share one gate.

3. The static random access memory according to claim 2, wherein the first pass gate transistor includes a first channel layer, the second pass gate transistor includes a second channel layer, and the first channel layer and the second channel layer are located on a dielectric layer covering the first CFET and the second CFET.

4. The static random access memory according to claim 3, wherein the gate is located above the first channel layer and the second channel layer.

5. The static random access memory according to claim 3, wherein the gate is located below the first channel layer and the second channel layer.

6. The static random access memory according to claim 3, wherein the first channel layer and the second channel layer are embedded in the gate.

7. The static random access memory according to claim 1, wherein the first path and the second path are vias.

8. The static random access memory according to claim 1, wherein the first pass gate transistor is connected to a first bit line by a via, and the second pass gate transistor is connected to a second bit line by a via.

9. The static random access memory according to claim 1, wherein in the first tier, the first CFET and the second CFET are located in the same column.

10. The static random access memory according to claim 1, wherein in the second tier, the first pass gate transistor and the second pass gate transistor are located in the same column.

11. A static random access memory, comprising:

a first complementary field effect transistor (CFET);

a second CFET, wherein the first CFET and the second CFET are disposed in a first tier, an output of the first CFET is connected to an input of the second CFET through a first path, an input of the first CFET is connected to an output of the second CFET through a second path;

a first pass gate transistor, connected to the first CFET and located above the first CFET; and a second pass gate transistor, connected to the second CFET and located above the second CFET, wherein the first pass gate transistor and the second gate transistor are disposed in a second tier;

wherein in a plan view of the static random access memory, the first CFET is extended along an arrange line, the second CFET is extended along the arrange line, and the first path and the second path are located at different sides of the arrange line.

12. The static random access memory according to claim 11, wherein the first pass gate transistor and the second pass gate transistor share one gate.

13. The static random access memory according to claim 12, wherein the first pass gate transistor includes a first channel layer, the second pass gate transistor includes a second channel layer, and the first channel layer and the second channel layer are located on a dielectric layer covering the first CFET and the second CFET.

14. The static random access memory according to claim 13, wherein the gate is located below the first channel layer and the second channel layer.

15. The static random access memory according to claim 13, wherein the first channel layer and the second channel layer are embedded in the gate.

16. The static random access memory according to claim 11, wherein the first path and the second path are vias.

17. The static random access memory according to claim 11, wherein the first pass gate transistor is connected to a first bit line by a via, and the second pass gate transistor is connected to a second bit line by a via.

18. The static random access memory according to claim 11, wherein in the first tier, the first CFET and the second CFET are located in the same column.

19. The static random access memory according to claim 11, wherein in the second tier, the first pass gate transistor and the second pass gate transistor are located in the same column.

20. A static random access memory, comprising:

a first complementary field effect transistor (CFET); and a second CFET, wherein the first CFET and the second CFET are disposed in a first tier, an output of the first CFET is connected to an input of the second CFET through a first path, an input of the first CFET is connected to an output of the second CFET through a second path;

wherein in a plan view of the static random access memory, the first CFET is extended along an arrange line, the second CFET is extended along the arrange line, and the first path and the second path are located at different sides of the arrange line.

* * * * *